United States Patent [19]

Cowan

[11] Patent Number: 4,496,216
[45] Date of Patent: Jan. 29, 1985

[54] METHOD AND APPARATUS FOR EXPOSING PHOTOSENSITIVE MATERIAL

[75] Inventor: James J. Cowan, Lexington, Mass.

[73] Assignee: Polaroid Corporation, Cambridge, Mass.

[21] Appl. No.: 454,728

[22] Filed: Dec. 30, 1982

[51] Int. Cl.³ .................................................. G02B 5/18
[52] U.S. Cl. .................................. 350/162.17; 354/200
[58] Field of Search ..................... 350/162.11, 162.17, 350/162.2, 3.67, 3.7, 3.81; 354/200

[56] References Cited

U.S. PATENT DOCUMENTS 4,421,398 12/1983 Suzuki et al. ........................ 354/200

Primary Examiner—Bruce Y. Arnold
Assistant Examiner—William Propp
Attorney, Agent, or Firm—Philip G. Kiely

[57] ABSTRACT

Exposure patterns are formed in photosensitive material by multiple beam laser interferometry by a method which involves exposing said photosensitive material simultaneously to at least three coherent beams of exposing radiation wherein the sources of said beams are arranged substantially symmetrically around an axis perpendicular to the plane of said photosensitive material. Preferably, surface relief patterns are formed by developing said exposed material. Apparatus for providing such multiple coherent beams is also disclosed.

16 Claims, 29 Drawing Figures

METHOD AND APPARATUS FOR EXPOSING PHOTOSENSITIVE MATERIAL

BACKGROUND OF THE INVENTION

The preparation of surface relief structures in photosensitive materials is well known. Over the years, the art has learned how to reduce the dimensions of the relief lines or holes (viewed normal to the surface) to the point where they are measured in terms of micrometers and fractions of micrometers.

Extensive studies have been made, in particular, of periodic one dimensional structures prepared in positive type photosensitive materials or photoresists. (It will be appreciated that the terms "one dimensional" and "two dimensional" are terms of the art describing the relief structure from a view normal to the surface). One type of photoresist contains a photosensitive polymer which then exposed to light becomes soluble in an appropriate water base developer. After exposure and development, the initially flat surface of the photoresist becomes a surface relief structure whose depth varies depending upon the photoresist that has been etched away by the developer in proportion to the exposure light intensity. When exposed to an intensity variation that is periodic, such as a light interference pattern, a periodic surface profile will be formed which is everywhere proportional to the initial interference intensity pattern. Precise relief structures of this type can be made easily over relatively large areas using laser interference techniques.

It is known in the art to form relief diffraction gratings employing laser interference techniques. In general, such gratings are formed by exposing a photosensitive material such as a photoresist to two coherent interfering laser beams (recording beams) whose wavefronts are substantially plane and parallel. When such beams interfere, there is produced a stationary periodic fringe pattern consisting of maxima and minima of beam intensity. The spacing between adjacent maxima (or minima) is determined by the angle between the beams and by the wavelength of the exposing light. Depending upon the optical system used, substantially any spacing can be obtained down to about half the wavelength of the exposing light. The photosensitive material will thus be exposed to a periodic variation in intensity across its surface.

The above description applies to the formation of straight line gratings (one-dimensional gratings); that is, the maxima or minima of the developed image appear as straight parallel lines when viewed normal to the surface. A crossed grating (two-dimensional grating) can be obtained by rotating the photosensitive material 90° about an axis perpendicular to the center of the surface subsequent to the first exposure and exposing a second time. In this case, the surface is subjected to two periodic intensity variations at right angles to each other. Upon development, the resulting relief structure will consist of a rectangular array of peaks and valleys; in the case of a positive photoresist, the peaks correspond to the areas where the combined intensity of the two exposures was the least, or where there was no exposure, and the valleys to the areas where the exposure was the greatest.

Variations in the symmetry of the above described array are also possible. For example, by changing the angle between the two beams after the first exposure, one obtains a different grating spacing for each of the two perpendicular orientations. This can lead to points of intersection which are oblong instead of round. Alternatively, if the exposure plate is rotated to form an angle other than 90° between the two exposure positions, one would obtain a diamond-shaped rather than a square point of intersection array.

Copending application of James J. Cowan, Arthur M. Gerber and Warren D. Slafer, Ser. No. 234,959, now U.S. Pat. No. 4,402,571 filed Feb. 17, 1981 (common assignee), is directed to a method of producing accurate relief patterns in a photoresist in which individual features of the relief patterns can be of submicron size and in which the size and shape of the relief patterns are controlled, to a great extent, by manipulation of the exposure and development parameters of the photoresist as distinguished from the pattern or image to be projected onto the photoresist. The method involves exposing the photosensitive material at a first position to a laser interference pattern, rotating said material around an axis perpendicular to its surface to a second position and exposing said material at said second position for a laser interference pattern, wherein at least one and preferably both of said exposures is individually below the effective threshold for linear response of said material, the points of intersection of the two fringe patterns being exposed above said threshold as a result of the combined exposures, and developing said material.

A disadvantage to making patterns employing crossed grating methods arises from the sequential nature of the exposures. At the cross-over points of the maxima of each pattern, the exposure is maximum, and the subsequent etching is deepest; at the minima, the exposure is zero and there is substantially no etching at these points. But at the intermediate points the exposure is half of the maximum and subsequent etching of the exposed photosensitive material may lead to the formation of saddle points. Thus instead of obtaining an array of very deep holes in an otherwise flat surface, often an array of not very deep holes on a highly undulating surface is formed, which may be an undesirable condition for many applications. Furthermore, the array of holes is not close packed; in most cases the holes occupy only about half of the total surface area.

SUMMARY OF THE INVENTION

The present invention is directed to the formation of exposure patterns by multiple beam laser interferometry by exposing a photosensitive material simultaneously to at least three coherent beams of exposing radiation wherein the sources of said beams are arranged substantially symmetrically around an axis perpendicular to the plane of said photosensitive material. In a preferred embodiment, surface relief patterns are formed by developing said exposed material. The present invention is also directed to apparatus for providing such multiple coherent beams.

DETAILED DESCRIPTION OF THE INVENTION

Figure 1:
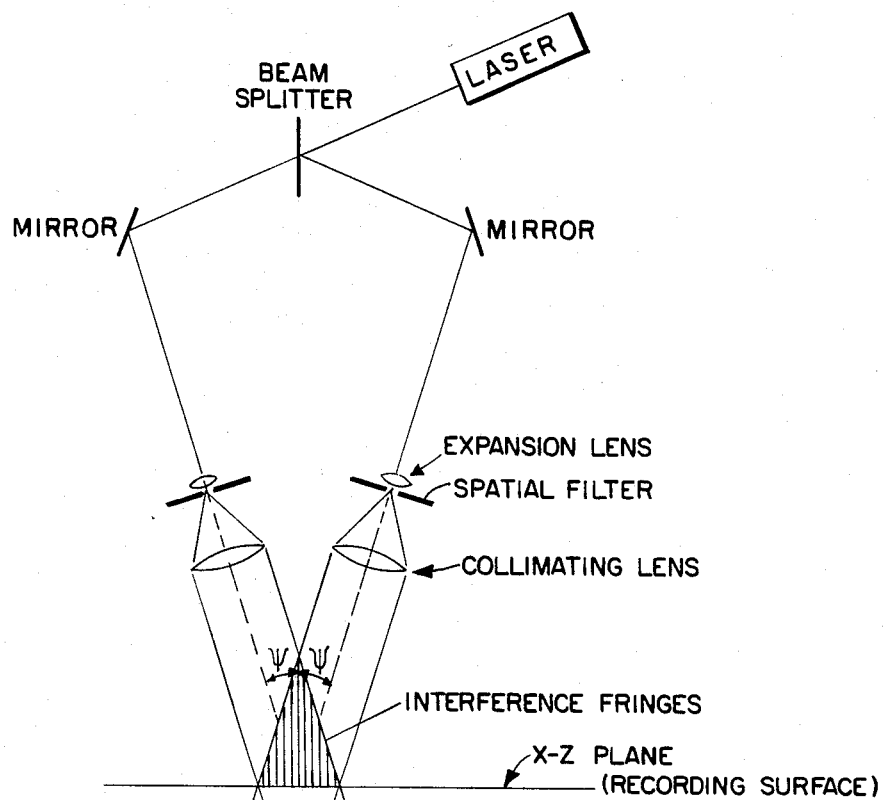
FIG. 1 is a schematic view of a typical laser diffraction imaging system.

The present invention is directed to a method for forming an exposure pattern in a photosensitive material by multiple beam laser interferometry. The present invention comprises exposing a photosensitive material to at least three coherent beams of exposing radiation wherein the sources of said beams are arranged substantially symmetrically around an exis perpendicular to the plane of said photosensitive material. Developing the thus-exposed material provides the relief pattern. In a preferred embodiment, the relief pattern obtained are close packed depressions or holes with dimension as small as the submicrometer range.

As stated above, in a preferred embodiment, the novel method of the present invention can provide close packed hexagonal or square and rectangular depressions. As will be seen circular depressions and configurations intermedite circular and hexagonal or square and rectangular can be obtained depending upon exposure level and development. Thus, the method and apparatus of the present invention can provide a wide variety of depression configurations, as desired. The discussion of tne invention is primarily in terms of the preferred embodiments, however.

To obtain the hexagonal and square or rectangular deep depressions of the described beams, as well as being arranged substantially symmetrically around an axis perpendicular to the plane of the photosensitive material, each source should also be located substantially equidistant from the photosensitive material. It should be understood that locating the source array equidistant is a preferred embodiment, and that if a distortion in the relief pattern is desired or acceptable such a requirement is not necessary. Further, another source of distortion in the relief pattern configuration is a difference in intensity of exposure from each of said sources. Therefore, in a preferred embodiment, the intensity from each source is substatially equal. In a particularly preferred embodiment, the relief pattern obtained comprises close packed hexagonal and square or rectangular holes.

Contrary to prior art methods, the present invention involves simultaneous multiple beam exposure whereas the prior art methods for forming relief patterns by exposure of photosensitive material, while adjustable to forming a variety of relief patterns, requires two separate exposure steps, with all the problems attendant with said steps, and are also unable to provide optional close packing of the depressions.

There are two basic optical configurations by which the present invention can be practiced: (1) division of wavefront, whereby a single expanded light wave from a laser is reflected back to the recording plane by an array of mirrors, preferably 3 or 4 mirrors, and (2) division of amplitude, whereby the initial laser beam is split into three or four equal parts and each is separately expanded to impinge on the recording plane. To form a hexagonal pattern, the tilt angles of the three mirrors are preferably equal. If, for example, one of the tilt angles were diferent from the other two, a distorted or "flattened" hexagonal pattern would result.

In the general configuration for the division of wavefront configuration, the narrow beam from the laser passes through an expansion lens and spatial filter combination and the resulting spherical wave impinges on an array of mirrors arranged substantially symmetrically about the center of the beam: three mirrors for a hexagonal array and four for a square or rectangular array. The tilt angle of the mirrors is adjusted so that the reflected light from each one falls on the same area of the recording surface. Each mirror surface acts as a separate source, as the angle of incidence is the tilt angle that each mirror makes with respect to a normal to the recording plane. This configuration generates spherical instead of plane waves. With a three-beam mirror array there may be a slight distortion of the ideal hexagonal shape with the amount of distortion depending on the degree of curvature of the wave. This effect can be minimized by using a low power (e.g., 5× or 10×) expansion lens and placing it far from the mirror array. With a four-beam mirror array the difficulty is more serious because a moire pattern cannot be eliminated with an off-axis configuration. The curvature problem can be solved by allowing the spherical wave to first impinge on a collimating mirror, which could be an off-axis paraboloid, then having the parallel light beam be incident on the four-mirror array.

Care must be taken with the division of wavefront configuration to assure a uniform intensity across the surface of each array mirror, and to maintain fringe stability for long exposure times. The first problem arises because of the Gaussian nature of the initial expanded beam. Each array mirror intercepts a portion of this beam that is intense at the center of the array and drops off exponentially to the edge. This problem can be minimized by using a high power expansion lens, or a long distance from the expansion lens to the mirror array, or both; and also by flattening the initial Gaussian distribution with an apodizing filter placed before the spatial filter.

The fringe stability is generally good for this configuration for short exposure times, since all the beams travel along essentially the same path and the only potentially moving parts are the mirror array and target. However, for long times, the fringe movement should be kept stable. This can be achieved by monitoring the phase at the recording surface (for example, by observing the interference pattern for any two sets of beams for the three-beam system, or three sets for the four-beam system) and feeding the signal back electronically to a controller which moves the corresponding mirrors toward or away from the target.

The second optical configuration is division of amplitude, achieved by using several beam splitters that produce, from the initial beam, three or four other beams of equal intensity that are separately expanded to impinge on the target. For example, with the three-beam array, the initial beam goes to a variable beam splitter which is adjusted to send $\frac{1}{3}$ of the light to an expansion lens and spatial filter combination mounted above two other similar lenses, which are in a plane parallel to the surface of the optical table. The $\frac{2}{3}$ remaining light is split with a 50-50 beam splitter betweem the bottom two lenses, so that each lens receives $\frac{1}{3}$ of the original light intensity. The three expansion lenses, as viewed from the front, form apexes of an equilateral triangle for a symmetrical pattern. For a less symmetrical pattern, the lenses would form apexes of an isosceles or scalar triangle. The normal to the center of the recording surface passes through the center of the array. This configuration has the advantage over the division of wavefront systems in that there is a Gaussian distribution for each lens, so that making the intensities equal at the recording surface is not difficult. Also, electronic fringe stability control can easily be utilized by inserting a small phase-shifting element into into each beam before it passes into the expansion lens. Two phase-shifting elements are required for the three-beam system, and three for the four-beam system.

The optical arrangement for the four-beam system is similar to the three-beam system, except that the variable beam splitter sends half the initial light to an upper array of two lenses, located in a plane above a similar array of two lenses located below them. There is also an additional beam splitter in the upper plane to divide the light between the upper two lenses. For a square pattern, this array, viewed from the front, resembles a square. For a rectangular pattern, the array resembles a rectangle.

The light reaching the recording surface with this configuration consists of spherical waves, which are satisfactory for many applications. Also, because of the symmetrical arrangement, the moire fringes arising with the four-beam pattern can be essentially eliminated. If collimated light is desired, each expanded beam can impinge on a collimating mirror and direct the parallel light to an off-axis target.

In utilizing either the three or four beam configurations, care must be taken to equalize path lengths from the points where the beam (or the wavefront) is split to the target, if a laser with a limited coherence length is used. With the mirror array, the distance from each mirror to the target must be equal. With the array using the beam splitters, the light path distances from each beam splitter to the target must be equal. For example, with the three-beam array, the distance from the variable beam splitter to the upper expansion lens to the target must be equal to the path taken by either of the lower beams through its respective expansion lens to the target. The path lengths from the 50-50 beam splitter to each of the lower expansion lenses to the target must also be equal. Similar considerations apply for the four-beam array.

The interference patterns of two beams of coherent light can be described by the standard equation for interferometry. A typical laser diffraction imaging system for providing the interference patterns is shown in FIG. 1. It is assumed there are two plane waves, whose electric fields, $\vec{E_1}$, and $\vec{E_2}$ are given by the equations $$\vec{E} = A_1 \exp[i(\vec{k_1} \cdot \vec{r_1} - \omega t)]\hat{j} \qquad (1)$$

and $$\vec{E} = A_2 \exp[i(\vec{k_2} \cdot \vec{r_2} - \omega t)]\hat{j}$$

where $A_1$ and $A_2$ are the respective amplitudes, $\vec{k_1}$ and $\vec{k_2}$ the wave vectors, $\vec{r_1}$ and $\vec{r_2}$ the directions of propagation, $\omega$ the frequency, t the time, and $\hat{j}$ a unit vector expressing the transverse nature of the fields. The intensity, I, is given as the vector sum of the absolute square of these waves:

$$I = |\vec{E_1} + \vec{E_2}|^2 \qquad (2)$$

$$I = |E_1|^2 + |E_2|^2 + \vec{E_1} \cdot \vec{E_2}^* + \vec{E_1}^* \cdot \vec{E_2}$$

where the asterisk refers to the complex conjugate. If the expressions for $\vec{E_1}$ and $\vec{E_2}$ are substituted into equation (2) and simplified the following equation is obtained:

$$I = A_1^2 + A_2^2 + 2A_1A_2 \cos\theta \qquad (3)$$

The first term, $A_1^2$, is the intensity that would result if only the first wave were present; the second term, $A_2^2$, is the intensity if only the second wave were present; and the third term, $2A_1A_2 \cos\theta$, is the interference intensity between the two waves. If the two waves were neither coherent nor simultaneous, the third term would vanish.

Figure 2:
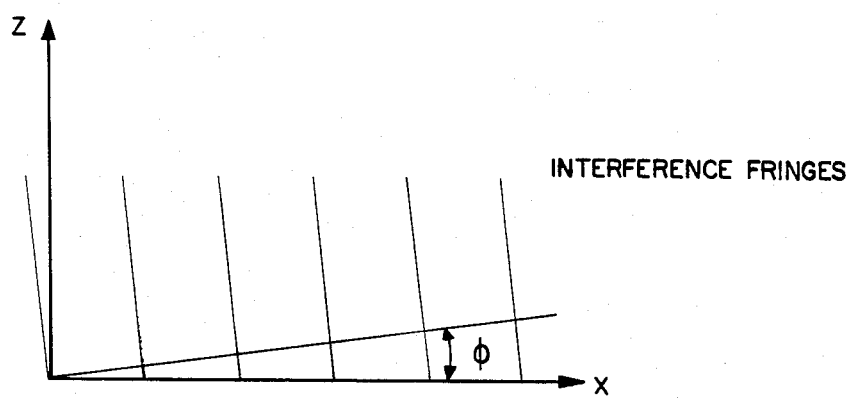
FIG. 2 is a schematic view of the interference fringes generated by the system of FIG. 1 with respect to the recording plane.

The angle $\theta$ is given by $$\theta = 2\pi/d(x \cos\phi + z \sin\phi) \qquad (4)$$

where d is the fringe spacing, defined by $d = \lambda/2 \sin\psi$, being the illuminating wavelength and $\psi$ the half-angle between the propagation direction of the two beams. $\psi$ is the angle that the normal to the fringes makes with the x-axis, as illustrated in FIG. 2, wherein x-z is the plane of the recording material. For the case considered here, where the two beams define the $x=\psi$ plane, the angle $\psi$ is zero. This means that the intensity varies sinusoidally in the x-direction but is constant in the z-direction.

In holographic grating applications, the most desirable fringe contrast is obtained by setting the amplitudes of the two waves equal, i.e., $A_1 = A_2$. A further simplification results if the amplitudes are normalized, i.e., if $A_1 = A_2 = 1$. Thus the interference equation takes the simple form $$I = 1 + 1 + 2\cos\theta \qquad (5)$$
$$= 2 + 2\cos\theta$$
$$= 2(1 + \cos\theta)$$

Since the cosine varies between $+1$ and $-1$, the intensity varies from 0 to 4. If the beams were neither coherent nor simultaneous, the intensity would be constant at $I=2$.

If a recording surface is exposed to a two-beam interference pattern as described above and developed, assuming conditions of linearity, a one-dimensional grating with a sinusoidal profile is obtained whose shape is proportional to the intensity given in equation (5). To form a square cross pattern, after the recording surface is rotated 90°, a second exposure is made with the same two beams, according to procedure described and claimed in copending application Ser. No. 234,959, supra. The resultant intensity distribution would now be the sum of the two separate exposures, $I_1$ and $I_2$, given by $$I = I_1 + I_2 \qquad (6)$$
$$= 2(1 + \cos\alpha) + 2(1 + \cos\beta)$$
$$= 4 + 2\cos\alpha + 2\cos\beta$$

where $$\alpha = \frac{2\pi}{d}(x\cos 0° + z\sin 0°) \;(\phi = 0°)$$
$$= \frac{2\pi x}{d}$$

and $$\beta = \frac{2\pi}{d}(x\cos 90° + z\sin 90°) \;(\phi = 90°)$$
$$= \frac{2\pi z}{d}$$

For the second exposure, a value of $\phi = 90°$ expresses the fact that the second set of fringes is oriented at 90° with respect to the first. For these fringes the intensity is constant along x but varies sinusoidally along z.

Figure 3:
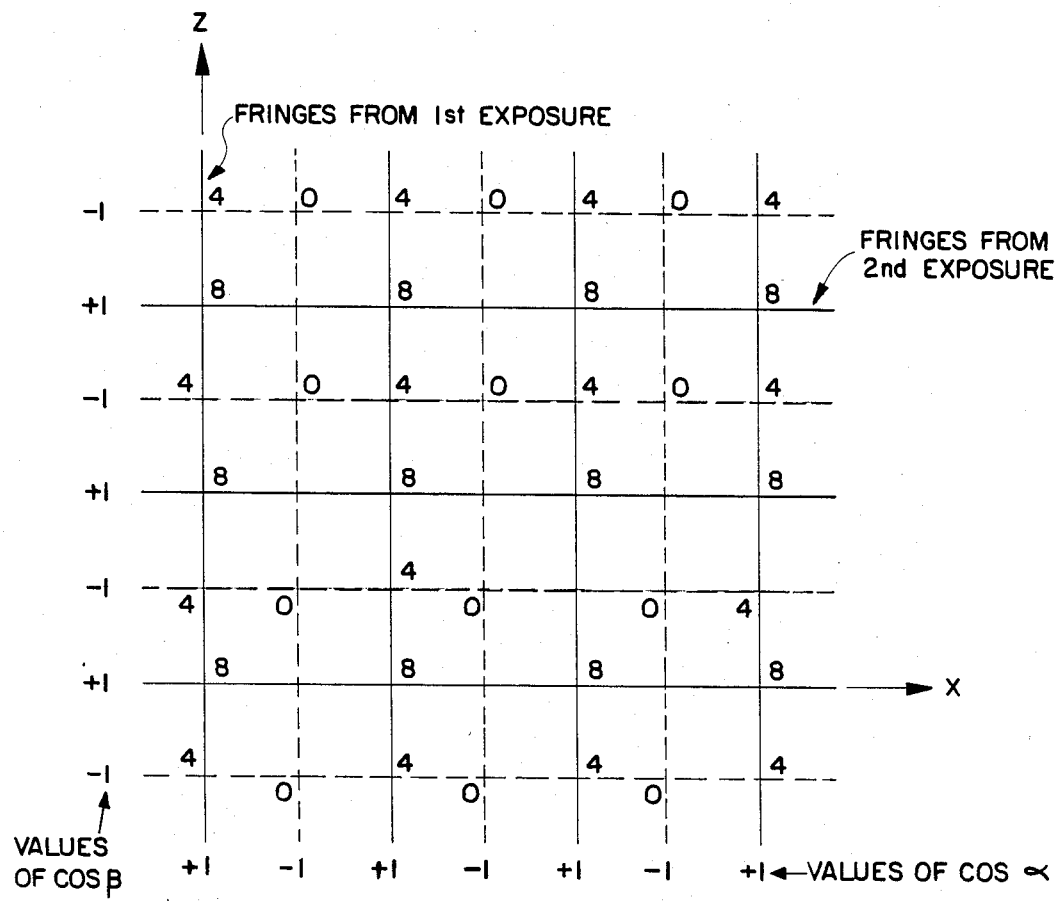
FIG. 3 is a plot of intensity distribution obtained from the imaging system of FIG. 1 employing two sequential exposures at 90° to one another.

FIG. 3 shows a plot of the intensity distribution in the x-z plane calculated from equation (6). The solid lines show the intensity values at the maxima, where the cosine equals $+1$, and the dotted lines, the minima, where the cosine equals $-1$. The largest intensity is where both $\cos\alpha$ and $\cos\beta$ cycle to their maximum values of $+1$, to give I=8. The smallest intensity is where they cycle to their minimum values of $-1$, giving I=0. Halfway between these extremes both $\cos\alpha$ and $\cos\beta$ equal zero, and I=4 is obtained. Thus, with this recording scheme in a positive-wording photoresist, there is deep etching at the center cross-overs and no etching at the minimum points, but the intermediate positions may give rise to saddle points. Even utilizing the nonlinear response of a photoresist, where low exposures etch proportionally less than high exposures, there is a limitation on the center etch depth, in order to minimize the saddle point etching. An approximation of the relative etch depths is obtained by considering the ratio of intensities; for example, from maximum to minimum the ratio is $I_{max}/I_{min} = 8/0 = \infty$, which is highly favorable, but the ratio between the center and the saddle points is $I_{max}/I_{int} = 8/4 = 2$, which is not so favorable.

Figure 4:
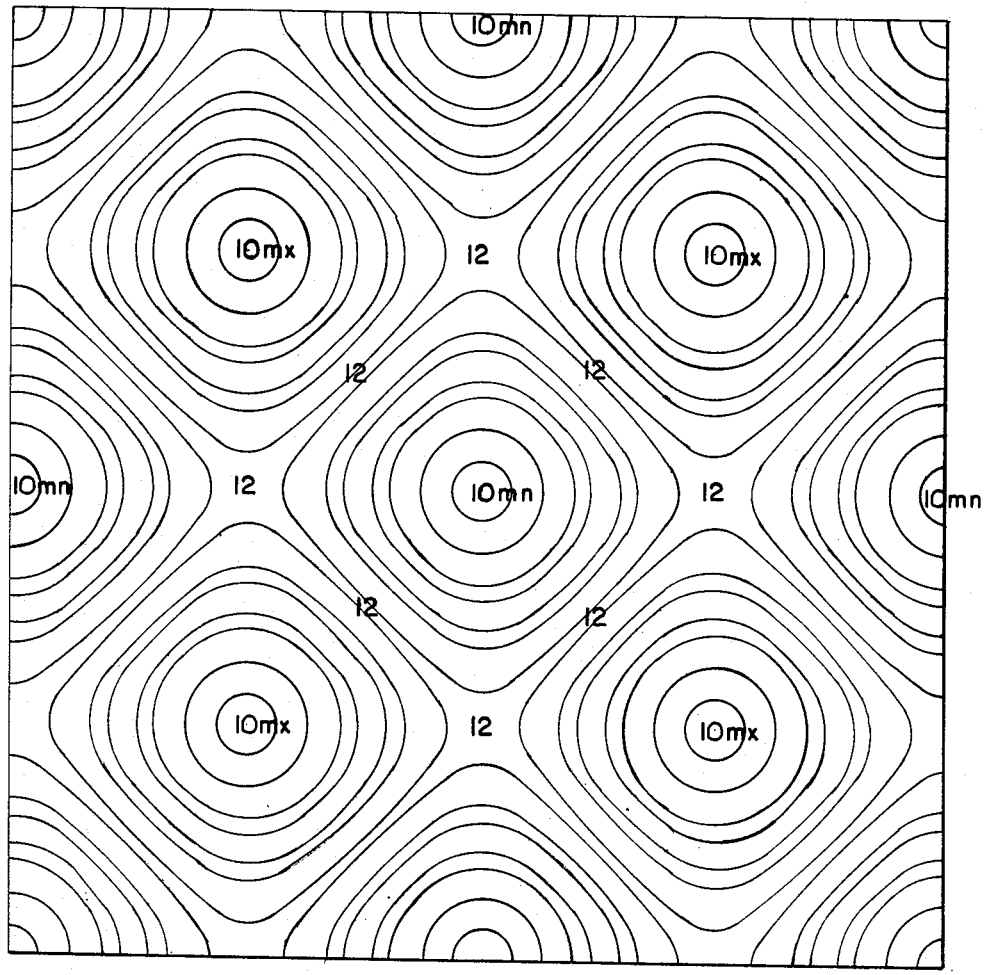
FIG. 4 is a computer representation of the relief pattern obtained from the intensity distribution plot of FIG. 3.

FIG. 4 is a computer representation of equation (6), showing equi-intensity contours. The appearance of almost perfect circles at the maxima cross-over regions 10MX and at the minima cross-over regions 10MN explains why an array of round holes on the surface of a sheet of photoresist after exposure and development would be expected, assuming the threshold exposure is not exceeded for etching at the saddle points 12.

If a rectangular instead of a square array was desired using the prior art two-beam sequential technique, the half-angle $\psi$ would be changed to a new value $\psi'$ for the second exposure, so that a new fringe spacing d' would be obtained for the second set of fringes perpendicular to the first set that had spacing d.

Unlike the prior art sequential exposure technique, the present invention contemplates the simultaneous exposure by at least three beams of coherent light arranged substantially symmetrically around an axis perpendicular to the recording surface, e.g., photoresist. By the method of the present invention, advantageous and novel relief patterns are obtained.

Figure 5:
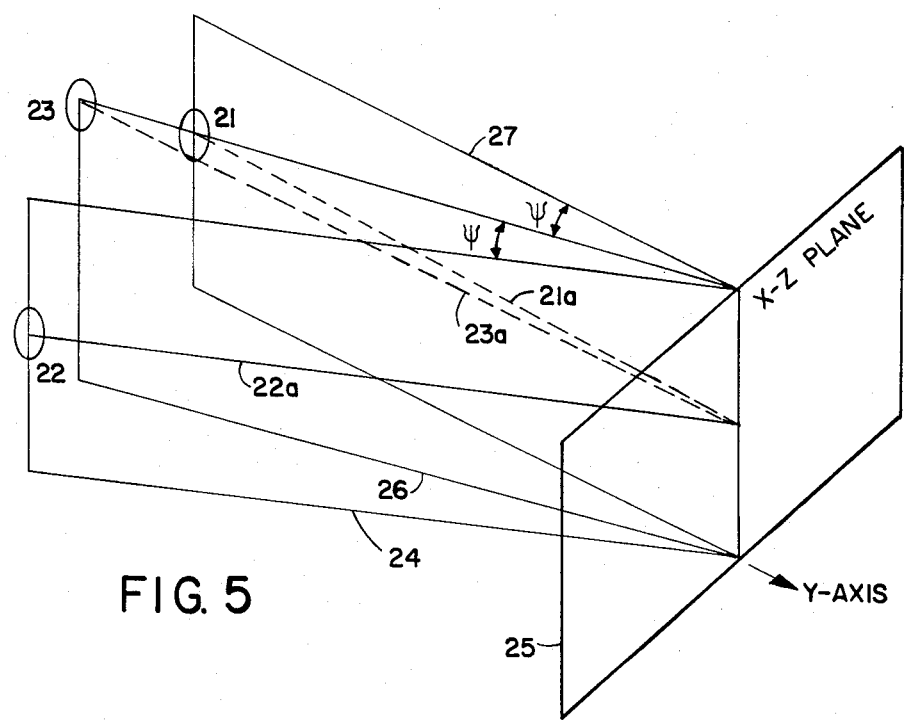
FIG. 5 is a schematic view of one exposure system of the present invention.

Referring to the drawings, FIG. 5 is a schematic view of an apparatus of the present invention wherein sources of coherent light 21, 22 and 23, are located symmetrically and equidistant around an axis perpendicular to the plane x-z of the recording surface 25. Beams 21A, 22A and 23A are contained in imaginary planes 24, 26 and 27 respectively.

Figure 7:
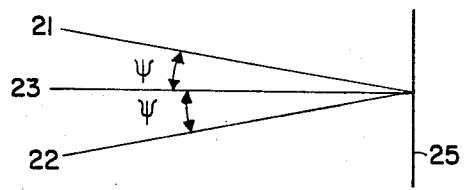
FIG. 7 is a top view showing the arrangement of the light sources of the system of FIG. 5.
Figure 8:
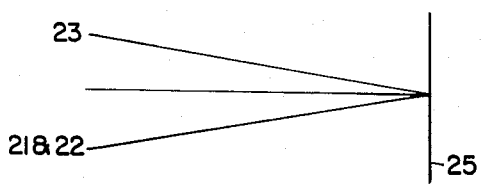
FIG. 8 is a side view showing the arrangement of the light sources of the system of FIG. 5.
Figure 6:
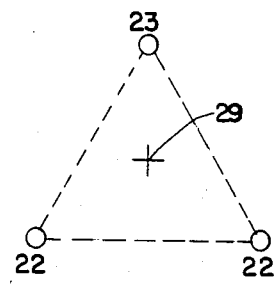
FIG. 6 is an end view of the system of FIG. 5 looking from the recording surface toward the light sources.

FIG. 6 is an end view looking from the x-z plane of the recording surface 25 of the photosensitive material toward sources 21, 22 and 23 showing their symmetrical and equidistant arrangement around axis 29, which is an axis perpendicular to the plane of recording surface 25. FIGS. 7 and 8 are top and side views, respectively, showing the arrangement of the sources of exposing coherent radiation with respect to the recording surface 25.

If the recording plane is illuminated simultaneously with three coherent beams arranged symmetrically about an axis perpendicular to the recording surface, the form of these fields is the same as given in equation (1), and the intensity is the absolute square of their vector sum, as follows:

$$I = |\vec{E_1} + \vec{E_2} + \vec{E_3}|^2$$

with $\vec{E_n} = A_n \exp[i(\vec{k_n} \cdot r_n - \omega t)]\hat{j}$ $n = 1, 2, 3$ After substituting and simplifying, what is obtained is:

$$I = A_1^2 + A_2^2 + A_3^2 + 2A_1A_2\cos\alpha + 2A_1A_3\cos\beta + 2A_2A_3\cos\gamma \quad (7)$$

If we set the amplitudes equal and normalize, we have:

$$A_1 = A_2 = A_3 = 1$$

and equation (7) simplifies to $$I = 3 + 2\cos\alpha + 2\cos\beta + 2\cos\gamma \quad (8)$$

In this case $$\alpha = \frac{2\pi}{d}(x\cos 0° + z\cos 0°)\ \phi = 0°$$

$$= \frac{2\pi x}{d}$$

$$\beta = \frac{2\pi}{d}(x\cos 60° + z\sin 60°)\ (\phi = 60°)$$

$$= \frac{2\pi}{d}\left(\frac{x}{2} + \frac{\sqrt{3}z}{2}\right)$$

$$\gamma = \frac{2\pi}{d}(x\cos 120° + z\sin 120°)\ (\theta = 120°)$$

$$= \frac{2\pi}{d}\left(\frac{\sqrt{3}}{2}x - \frac{z}{2}\right)$$

The expressions for $\alpha$, $\beta$, and $\gamma$ signify that each set of interference fringes is rotated 60° from each of the other sets. In this case, d is the fringe spacing for any two pairs of beams, and is defined as before $$d = \lambda/2\sin\psi$$

but now $\psi$ is the solid half-angle between the planes containing the two beams that are each parallel along the vertical axis to a plane perpendicular to the recording plane, as shown in FIG. 5. The fringe spacing d, is the same for any two pairs of beams because the sources are arranged symmetrically about an axis equidistant from the sources. If the sources are not arranged symmetrically, the half angle $\psi$ as defined above, and thus the fringe spacing d, would be different for each pair of beams.

Figure 9:
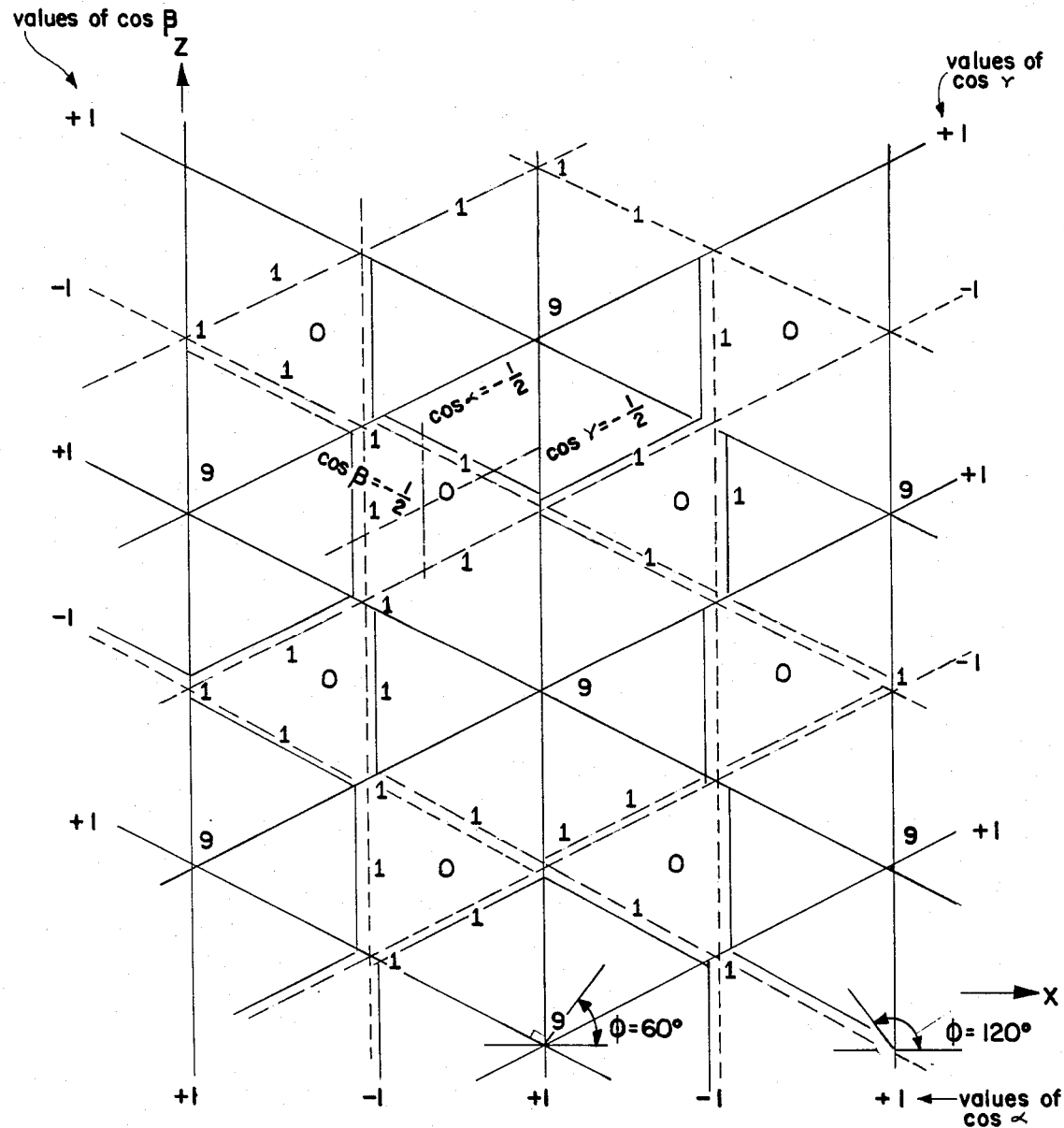
FIG. 9 is a plot of intensity distribution obtained from the imaging system of FIG. 5.

The intensity distribution obtained from equation 8 is plotted in FIG. 9, where the solid lines are the maxima of the fringe pattern for each pair of beams, with the cosine$=+1$, and the dotted lines, for the cosine$=-1$, as before. With a symmetrical array of sources, the fringe spacing d, is the same for each pair of beams. The 60° angle between each interference fringe set is also apparent. The resulting pattern is an array of large hexagons surrounded by smaller triangles. The maximum value (for $\cos\alpha = \cos\beta = \cos\gamma = +1$) is $I=9$ and is obtained at the intersection of the maxima for all three waves at the center of the hexagons. The minimum value is obtained where all three cosine values equal $-\frac{1}{2}$ giving $I=0$, and these are found at the centers of the small triangles. Around the periphery of the hexagons the intensity is constant at $I=1$ (two cosine values$=+1$ and the third$=-1$). The area of the hexagons out to the $I=1$ intensity line is 75% of the total surface area. The maximum to minimum intensity ratio is highly favorable, i.e., $I_{max}/I_{min} = 9/0 = \beta$. The ratio of intensities from the maximum to the edge is $I_{max}/I_{edge} = 9/1$. In this case the edges represent saddle points between the zero exposure points at the small triangles, so this ratio can be compared with that of the previous sequential case, which was 2/1. Thus, with the hexagonal array there are high exposures at the centers, and thus deep etching is obtained without the threshold for development around the periphery of the hexagons being exceeded with concomitant etching. Furthermore, deep etching can be achieved while still having a close-packed array of holes occupying about 75% or more of the surface area rather than the about 50% value obtained with the prior art two-beam exposure system.

If the presence of the saddle points (i.e., slightly undulating surface) can be tolerated, then the development threshold can be exceeded at the $I=1$ periphery, and a truly close-packed hexagonal array with no remaining flat surface will be obtained except for the zero exposure points of the small triangles. This configuration is apparent from the computer plot shown in FIG. 10, discussed below.

A further benefit of the three beam simultaneous recording scheme is that the correct phase relationship is maintained between the three beams. This can be seen from the way the interference pattern is constructed. Once the fringe pattern has been made for any two pairs of beams (i.e., $A_1$ and $A_2$; and $A_1$ and $A_3$,), then the phase of the third pair ($A_2$ and $A_3$) is fixed relative to the first two, with the maximum intensity for all three beams always coinciding at the same point within each hexagon. Shifting any one of the phases with respect to the other two changes the location of this maximum point in the x-z plane, but does not alter the relative phase relations.

If the hexagonal array were made by three separate two beam exposures, this phase relationship would be difficult to maintain and the intensity ratios would not be as desirable. For example, the intensity by this technique would be expressed by $$I = 6 + 2\cos\alpha + 2\cos\beta + 2\cos\gamma \quad (9)$$

which is the sum of three separate two-beam exposures, the angles being defined the same as in equation (8). In this case $I_{max}=12$, $I_{edge}=4$, and the intensity ratio is $I_{max}/I_{edge}=12/4=3/1$ (instead of 9/1 for the simultaneous exposure).

Figure 10:
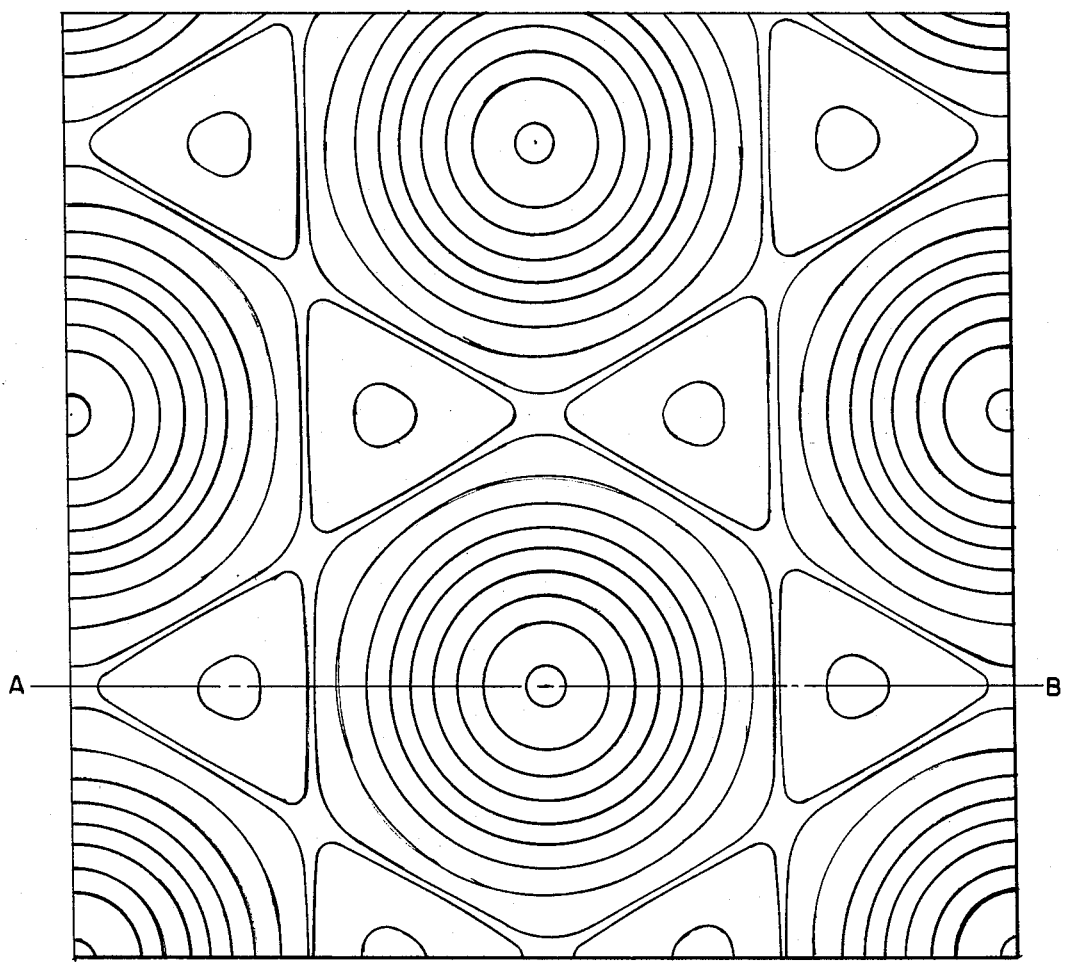
FIG. 10 is a computer representation of the relief pattern obtained from the intensity distribution plot of FIG. 9.
Figure 11:
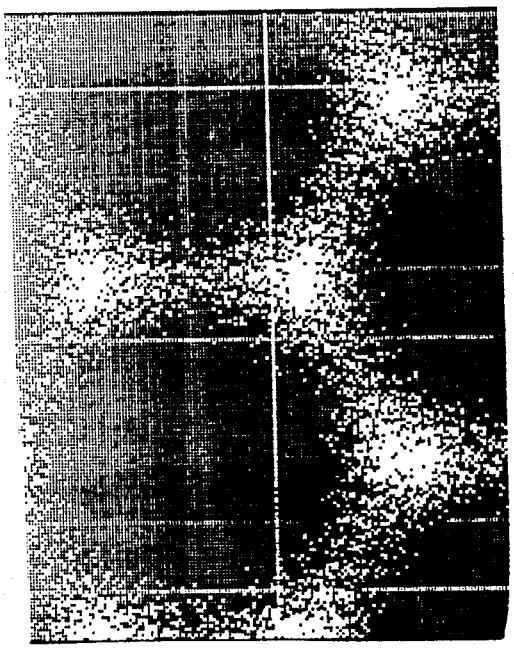
FIG. 11 is another computer representation of a relief pattern obtained from the imaging system of FIG. 5.
Figure 12:
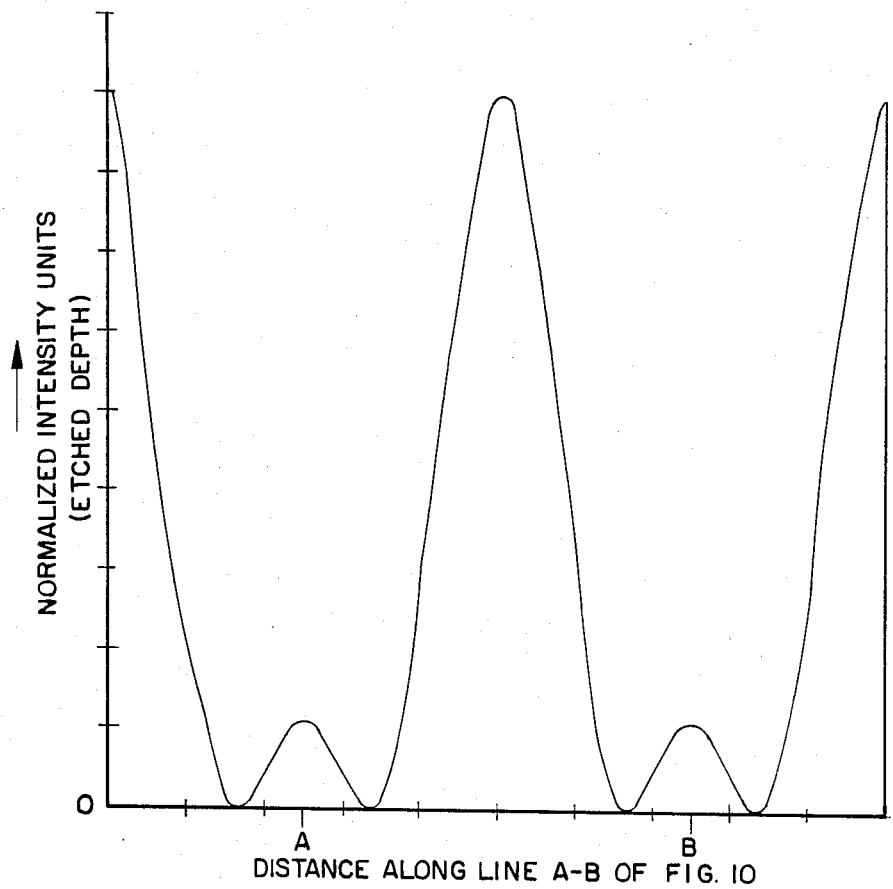
FIG. 12 is a side view of the relief pattern of FIG. 11.

FIG. 10 is the computer plot of the intensity distribution obtained from equation 8 for the hexagonal array, where equi-intensity contours are shown. The almost perfect circular intensity pattern within the hexagons is evident. FIG. 11 is a plot of the intensity probability of equation 8. It illustrates an array where etching was allowed to continue beyond the $I=1$ saddle points. A close-packed hexagonal array, with the lowest exposure areas indicated in white around the hexagons, is observed. In this over-etched condition, these zero-exposure points (the white areas) are the centers of the small triangles shown in FIG. 10. These points, when connected, define a close-packed array of larger hexagons. FIG. 12 shows the intensity profile cutting through the center of a hexagon along line A-B of FIG. 10 ($I=9$), and including the zero exposure points ($I=0$) and the saddle points ($I=1$). Assuming that etching is directly proportional to exposure intensity, a side view of the etched depth would be represented by FIG. 12.

The three coherent beams arranged symmetrically around an axis perpendicular to the plane of the photosensitive material may be provided by a division of amplitude of a laser beam or by a division of wavefront of a laser beam.

A suitable arrangement for providing exposure of photosensitive material by division of amplitude technique would employ a laser emitting a beam of coherent light which would be divided into thirds by beam splitters. For an ideal symmetric pattern, each of the resulting three beams would be directed through an appropriate lens and spatial filter positioned symmetrically and equidistant around an axis perpendicular to the plane of the photosensitive material.

Figure 13:
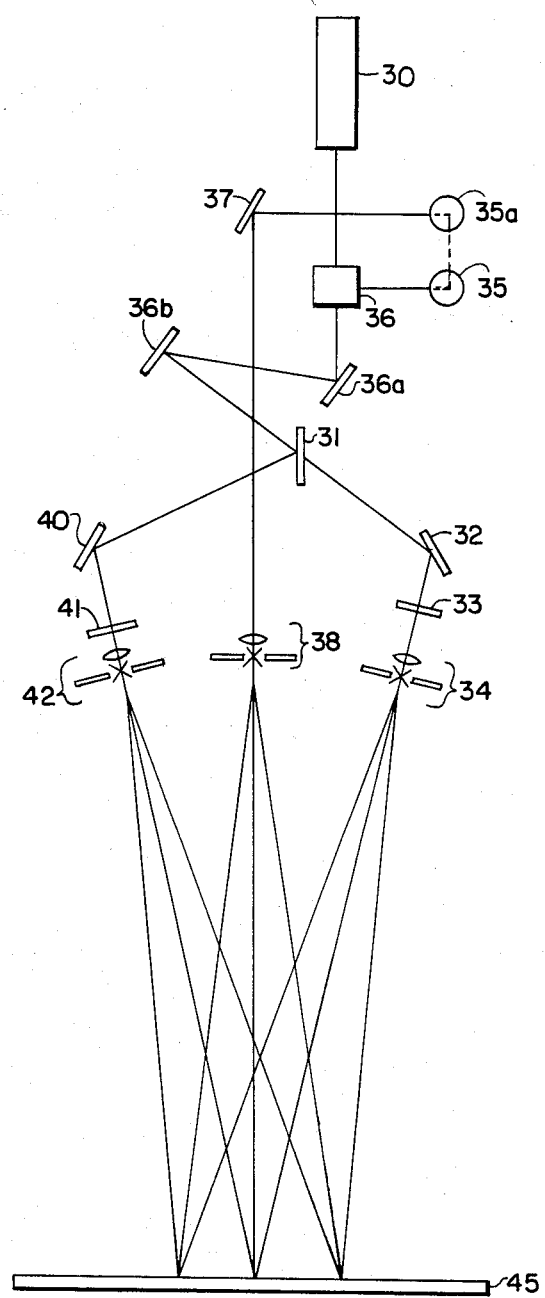
FIG. 13 is a schematic arrangement of an imaging system of the present invention.

Referring to FIG. 13, a representative arrangement is schematically set forth for providing a three-beam simultaneous exposure for obtaining a hexagonal array of holes. A coherent beam of light is emitted from laser 30, impinges on variable beam splitter 36 which directs one-third of the beam to mirrors 35, 35A and 37 lens and then to lens and spatial filter 38. The two-thirds of the beam passing through beam splitter 36 is incident on mirrors 36a and then 37a (to equalize the beam path length) to 50/50 beam splitter 31 directing one-half of the beam to mirror 32 and one-half of the beam to mirror 40. The beam of coherent light from mirror 32 is directed through phase shifter 33 to lens and spatial filter 34. The beam of coherent light from mirror 40 passes through phase shifter 41 to lens and spatial filter 42. Lens and spatial filters 34, 38 and 42 are located symmetrically and equidistant around an axis perpendicular to the surface of the plane of the photosensitive material as indicated by the arrangement shown FIG. 6. The three sources of the coherent light form an equilateral triangle around an axis perpendicular to the plane of the surface of the photosensitive material.

In an alternative embodiment, the three-beam exposure is accomplished by a division of wavefront system. In this system a beam of coherent light from a laser passes through a lens and spatial filter and is incident on three mirrors arranged symmetrically and equidistant around an axis perpendicular to the plane of the surface of the photosensitive material. Three beams are reflected from the mirror, illuminating the photosensitive material with a fringe pattern.

Figure 15:
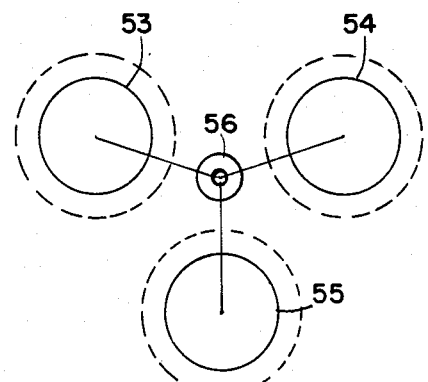
FIG. 15 is a schematic representation of the mirrors of the system of FIG. 14 viewing the mirrors from the plane of the recording surface.
Figure 14:
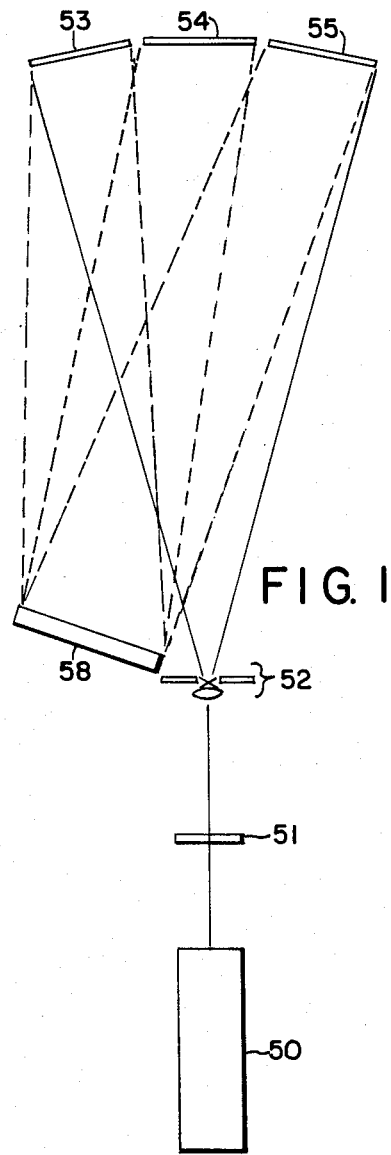
FIG. 14 is a schematic representtion of another embodiment of a three beam imaging system of the present invention.

Referring to FIG. 14 a schematic representation of an exposure system to provide division of wavefront fringe generation is shown. A coherent beam of light from laser 50 passes through apodizing filter 51 and lens and spatial filter 52 and is incident on mirrors 53, 54 and 55. The arrangement of the mirrors is also shown in FIG. 15, located symmetrically and equidistant around axis 56 which is perpendicular to the plane of the surface of the photosensitive recording material 58. Three beams of coherent light are reflected from the mirrors forming an interference pattern on photosensitive material 58.

In an alternative embodiment the beam of light from the laser is reflected from a collimating mirror to mirrors 53, 54 and 55 to provide a parallel wavefront for the interference pattern.

Figure 16:
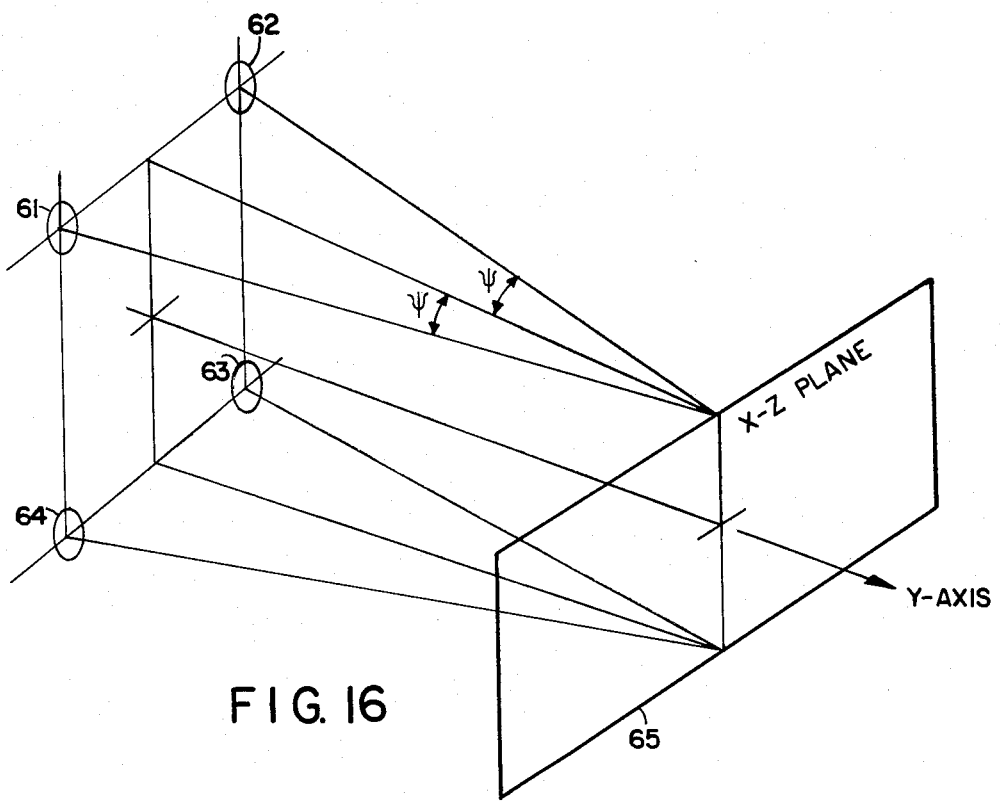
FIG. 16 is a schematic view of still another imaging system within the scope of the present invention.

In an alternative embodiment of the present invention, the photosensitive material is illuminated simultaneously by four coherent beams arranged symmetrically around an axis perpendicular to the plane of the surface of the recording surface. Referring to FIG. 16, a schematic representation of a four-beam exposure system for a square pattern formation is shown. Coherent beam sources 61, 62, 63 and 64 are located symmetrically and equidistant around an axis perpendicular to the plane x-z, of the surface of the recording material 65.

Figure 18:
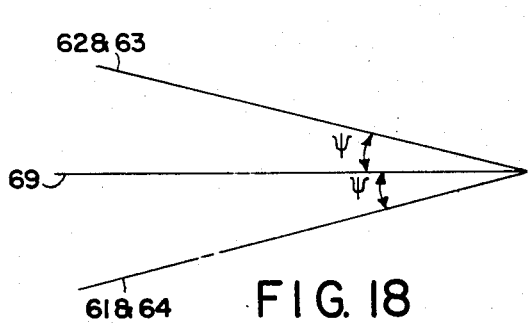
FIG. 18 is a top view of the light sources of the system of FIG. 16.
Figure 17:
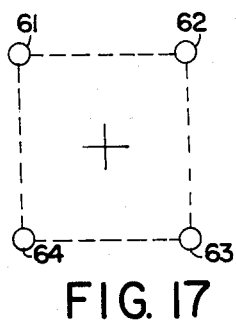
FIG. 17 is an end view of the light sources of the system of FIG. 16 looking from the plane of the recording surface.

FIG. 17 is an end view looking from the x-z plane of the recording surface looking toward sources 61, 62, 63 and 64 showing the symmetrical and equidistant arrangement of the sources around axis 69 which is perpendicular to said x-z plane. FIG. 18 is a top view of the coherent beam source wherein sources 62 and 63 and 61 and 64 lie upon each other and are equidistant and symmetrically arranged around axis 69.

If the recording plane is illuminated simultaneously with four coherent beams arranged symmetrically about an axis perpendicular to the recording surface the intensity would be the absolute square of the vector sum of all four waves, as follows:

$$I = |\vec{E_1} + \vec{E_2} + \vec{E_3} + \vec{E_4}|^2 \quad (10)$$

with $$\vec{E_n} = A_n \exp[i(\vec{K_n} \cdot \vec{r_n} - \omega t)]\hat{j}$$

$$n = 1, 2, 3, 4$$

After substitution of the fields $E_1$, $E_2$, $E_3$, $E_4$ into Equation (10) the following expression is obtained.

$$I = A_1^2 + A_2^2 + A_3^2 + A_4^2 + 2A_1A_2\cos\alpha + 2A_1A_3\cos\beta + \quad (11)$$
$$2A_1A_4\cos\gamma + 2A_2A_3\cos\delta + 2A_2A_4\cos\xi + 2A_3A_4\cos\zeta$$

and after normalizing ($A_1 = A_2 = A_3 = A_4 = 1$), it simplifies to $$I = 4 + 2\cos\alpha + 2\cos\beta + 2\cos\gamma + 2\cos\delta + 2\cos\xi + 2\cos\zeta \quad (12)$$

Figure 19:
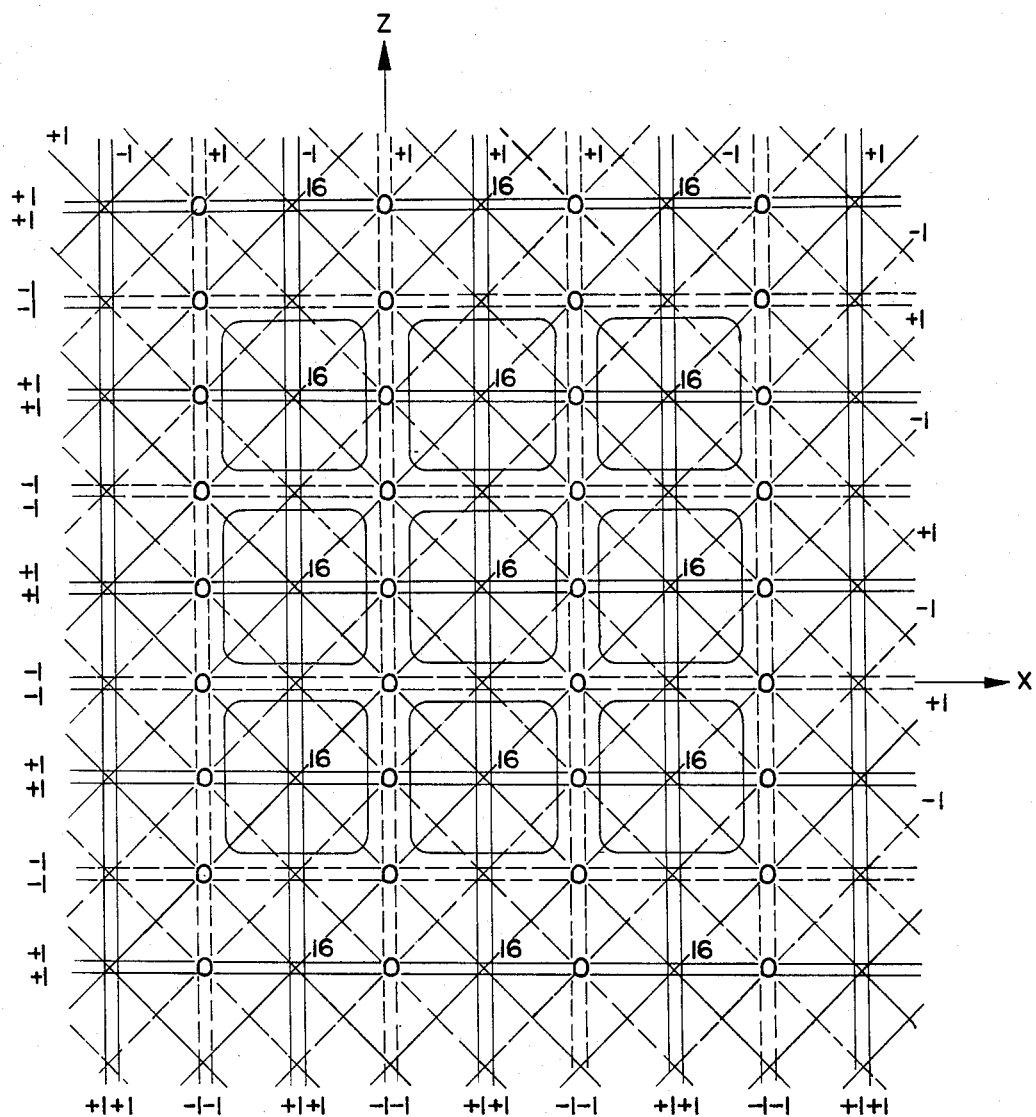
FIG. 19 is a plot of energy distribution obtained from the imaging system of FIG. 16.

The interference intensity diagram for the four-beam exposure system is shown in FIG. 19. This configuration differs from the three-beam exposure system in that there are two pairs of interference fringes that coincide. Thus, the fringes from sources 61 and 62 coincide with sources 63 and 64 and are shown as vertical lines in FIG. 19. The fringes from sources 61 and 64 coincide with sources 62 and 63 and these are shown as horizontal lines in FIG. 19. All of these fringes have the same fringe spacing. The fringes from the diagonal sources, i.e., sources 61 and 63 and 62 and 64, are shown as diagonal lines in FIG. 19. The spacing from the diagonal fringes is different from that of the vertical fringes.

Therefore the angles can be defined in the following way:

$$\alpha = \frac{2\pi}{d_1}(x\cos 0° + z\sin 0°) \quad (\phi = 0°)$$

$$= \frac{2\pi x}{d_1} \text{ (sources 61 and 62)}$$

$$\beta = \frac{2\pi x}{d_1} \text{ (sources 63 and 64)}$$

$$\gamma = \frac{2\pi}{d_1}(x\cos 90° + z\sin 90°) \quad (\phi = 90°)$$

$$= \frac{2\pi z}{d_1} \text{ (sources 61 and 64)}$$

$$\delta = \frac{2\pi z}{d_1} \text{ (sources 62 and 63)}$$

so that $\alpha = \beta$ and $\gamma = \delta$ where $d_1 = \frac{\lambda}{2\sin\psi}$, $\gamma$ and $\psi$ being defined the same as before -continued $$= \frac{2\pi}{d_2}(x\cos 45° + z\sin 45°) \quad (\phi = 45°)$$

$$= \frac{2\pi}{d_2}\left(\frac{\sqrt{2}}{2}x + \frac{\sqrt{2}}{2}z\right)$$

$$= \frac{\sqrt{2}\,\pi}{d_2}(x + z) \quad \text{(sources 61 and 63)}$$

$$\zeta = \frac{2\pi}{d_2}[x\cos(-45°) + z\sin(-45°)] \quad (\phi = -45°)$$

$$= \frac{2\pi}{d_2}\left(\frac{\sqrt{2}}{2}x - \frac{\sqrt{2}}{2}z\right)$$

$$= \frac{\sqrt{2}\,\pi}{d_2}(x - z) \quad \text{(sources 62 and 64)}$$

In this case $d_2 = d_1/\sqrt{2}$
because of the fact that the sources are on the diagonal of a square array of sources. Substituting, the following system is obtained $$\xi = \frac{2\pi}{d_1}(x + z)$$

$$\zeta = \frac{2\pi}{d_1}(x - z)$$

$I = 4 + 4\cos\alpha + 4\cos\gamma + 2\cos\xi + 2\cos\zeta$ (13) due to the fact that $\alpha = \beta$ and $\gamma = \delta$ Referring now to FIG. 19, the solid lines are for the maximum value of $+1$ for the cosine, and the dotted lines, the minimum value of $-1$ for the cosine. Where all values intersect at the center, (with $\cos\alpha = \cos\beta \cos\gamma = \cos\delta = \cos\Xi = \cos\delta = +1$) an intensity of $I = 16$ is obtained. At every peripheral point around the edge of each hole, the value of $I = 0$ is obtained. This can be proved by referring to FIG. 19 where it will be seen that the x-axis has been constructed to lie along the edge of a hole. The dotted horizontal lines are minimum values for source pairs 62 and 63 and source pairs 61 and 64 ($\cos\gamma = \cos\delta = -1$). Thus, the $4\cos\gamma$ term in equation (13) equals $-4$ and cancels the first constant term, which is equal to $+4$, in that equation. The vertical solid lines that lie along the z-axis are maximum values for source pairs 61 and 62 and source pairs 63 and 64 ($\cos\alpha = \cos\beta = +1$) that cycle along the x-axis from maximum to minimum, etc. But the projections of the fringe intensities from the diagonal sources (source pairs 61 and 63 and source pairs 62 and 64) onto the x-axis have the same values as the vertical fringes but the opposite phase. Thus the intensities are everywhere cancelled along the x-axis, resulting in a net intensity of zero. Because of symmetry the same argument holds along the z-axis. Thus, with the four-beam configuration an intensity ratio is obtained from the maximum to the edge of $I_{max}/I_{edge} = 16/0$, which makes it especially useful for the formation of deep holes.

Preferably, in the four-beam recording scheme the fourth source is aligned relative to the other three so that the fringe spacing is equal. A slight difference in fringe spacing will result in moiré fringes across the recording surface. The moiré fringe problem does not exist with the three-beam array.

If a rectangular rather than a square array were desired, the four sources as viewed from the front would resemble apexes of a rectangle rather than a square. The fringe spacing, $d_1$, would apply to angles $\alpha$ and $\beta$ as before, but a different fringe spacing, $d'_1$ would apply to angles $\gamma$ and $\delta$. The diagonal fringe spacing, $d_2$, would then be defined in terms of $d_1$ and $d_2$ by $d_2 = d_1 d'_1/\sqrt{(d_1)^2 + (d'_1)^2}$. The previous results for intensity values at the center and edge of each hole would also apply, except that the hole would be rectangular instead of square.

All previous equations assume that the light emitted from the laser is s-polarized; i.e., the electric vector is oriented perpendicular to the plane of the optical table. For any pairs of interfering beams whose plane of incidence is parallel to the plane of the optical table, no correction for polarization is necessary. For other pairs of beams whose plane of incidence is not parallel to the plane of the table, the intensity expressions must be modified, the extreme case being for beams perpendicular to this plane (for example, source pairs 61 and 64, or source pairs 62 and 63 of the four-beam array). In this case the interference terms, i.e., those terms containing angles, in the equations for intensity must be multiplied by $\cos\psi$, where $\psi$ is the angle between the two beams. For example, for an array where the fringe spacing is 1 micrometer, and a recording wavelength of 442 nm, the angle between two beams, would be $\psi = 25.5°$. Thus, $\cos\psi = 0.902$, which is a correction of less than 10%. For arrays having spacings of 2 micrometers or more (for $d = 2$ micrometers, $\cos\psi = 0.975$), the correction would amount to less than 3%. Thus polarization corrections are negligible and are omitted herein.

Figure 20:
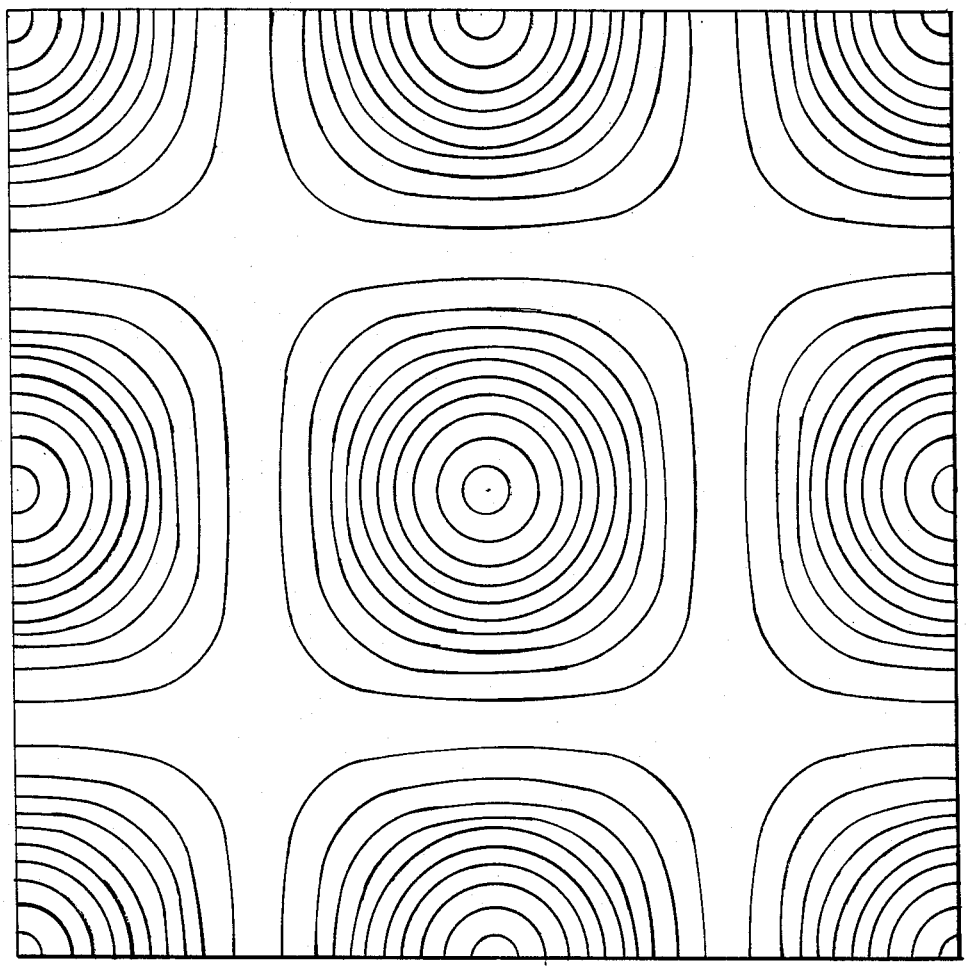
FIG. 20 is a computer representation of a relief pattern obtained from the energy distribution plot of FIG. 19.

FIG. 20 shows the equi-intensity contour computer plot of equation (13). The high density of contour lines at the centers reflects the high exposure values obtained there, while the area outside represents the eventual square pattern with vanishing edges that would result with excessive exposure and development. This array has the advantage that no consideration has to be given to a threshold exposure at the saddle points, since there are no saddle points. Almost vertical but vanishingly thin walls could be achieved with a planar top surface.

The photosensitive material exposed by the above-described techniques is preferably a photoresist and can be developed by techniques known to the art.

If the photosensitive material is a positive photoresist, then upon application of a developer those areas receiving the largest exposure will be preferentially etched away relative to those areas receiving the least exposure. A positive photoresist is rendered soluble by impinging light and thereby susceptible to etching by the developer. Alternatively, a photoresist could be chosen which would harden upon photoexposure (negative photoresist) whereupon the unexposed areas would be dissolved by appropriate treatment.

As examples of positive-acting photoresists mention may be made of initially hydrophobic, low molecular weight resins containing sensitizer, which, upon absorbing radiation change the solubility of the coating from aqueous alkali insoluble to aqueous alkali soluble. Suitable resins include phenol formaldehyde novolaks, novolaks in combination with styrene, methyl styrene and styrene-maleic anhydride copolymers and melamines.

As examples of representative negative-acting photoresists, mention may be made of polyvinyl cinnamate derivatives, vinyl ester containing cinnamylidene and alkyl ester prepolymers.

Additional details regarding positive and negative photoresist may be found, for example in W. S. DeForest, Photoresist Materials and Processes, McGraw-Hill, N.Y. 1975.

The photoresist is applied to any suitable substrate such as glass, silicon, plastic film or the like, through conventional procedures. Positive photoresists are preferred and they are usually applied in liquid form at room temperature to an appropriately cleaned substrate by spin coating in thicknesses which range from a fraction of one micrometer to a few micrometers depending on the spin rate and the photoresist. Dip coating and other coating techniques can also be utilized. In order to drive off any remaining solvents, the photoresist layer and substrate are usually exposed to an elevated temperature for a short period of time, a procedure known as "pre-baking", typically 90° C. for 20 minutes. Sensitivity of the photoresist is usually greatest without any pre-baking and a long pre-bake at lower temperature, e.g., 1 hour at 70° C., leaves the photoresist more sensitive than a short pre-bake at elevated temperature, e.g., 20 minutes at 90° C.

The photoresist is exposed to light to which it is sensitive in a predetermined pattern and then developed. Typical lasers and their associated wavelengths include the argon ion laser (458 nm) and the He-Cd laser (442 nm) with coherence lengths of about 5 cm and 12 cm, respectively.

The following non-limiting examples illustrate the novel method of the present invention.

EXAMPLE 1

Figure 21:
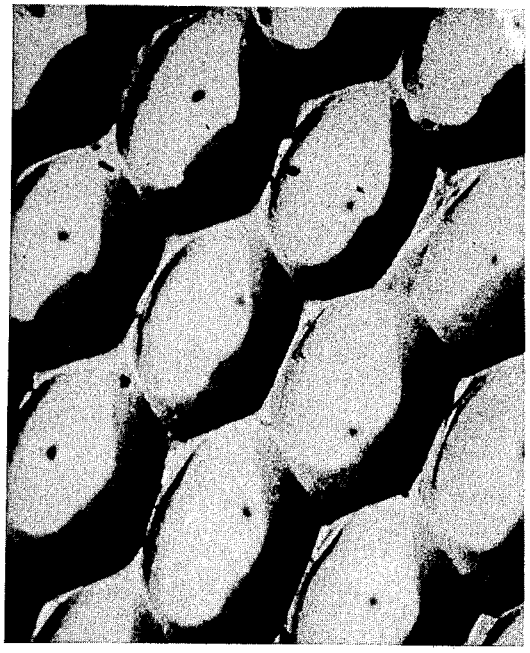
FIG. 21 is a scanning electron micrograph at 10,000× magnification of the relief pattern of Example 1.

Employing the exposure configuration set forth in FIG. 14, an array of hexagonal depressions was formed. The beam from a He-Cd laser at 442 nm was passed through a 10× expansion lens and a 15 micrometer spatial filter impinging on three mirrors 5 cm in diameter, spaced 78.7 cm from the expansion lens and filter and arranged in the same plane with the center of each mirror 10.2 cm from the other two mirrors. The tilt angles of the mirrors were adjusted so that the half angle $\psi$, between two pairs of beams was $\psi=4.22$; yielding a fringe spacing, d, for each pair, of 3 micrometers. The half angle for the third pair of beams was $\psi=5.07°$, yielding a fringe spacing d=2.5 micrometers. The three interfering beams from the mirrors impinged on a target 48 cm from the mirrors. The exposure time was 10 min. The target was about 10 micrometers thickness of Shipley photoresist AZ-1350J on 7 mil Mylar. The total intensity of the three beams was 31 mJ/cm$^2$. Development was carried out for 1 min in Shipley Developer AZ-351 diluted 3 to 1 with water. FIG. 21 is a 10,000× magnification scanning electron micrograph, top view, of the photoresist after development showing a flattened hexagonal shape, with the distance between two pairs of walls equal to 3 micrometers and the third pair of walls equal to 2.5 micrometers.

EXAMPLE 2

Figure 22:
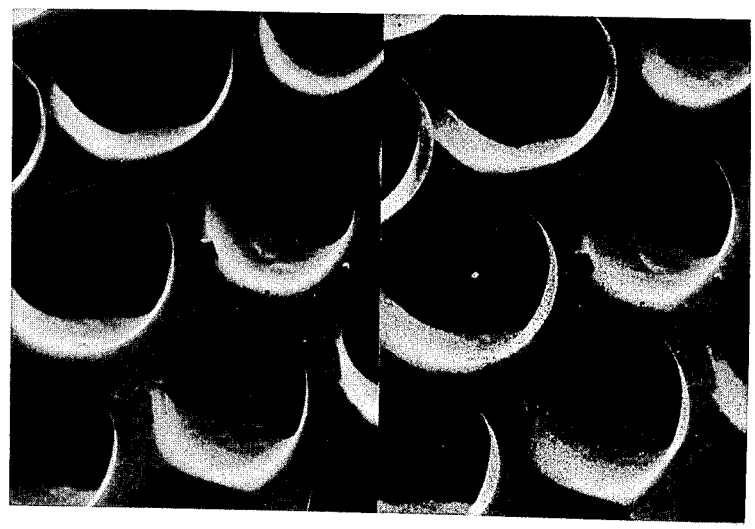
FIG. 22 is a stereo pair transmission electron micrograph at 50,000× magnification of cellulose acetate butyrate replica of the relief pattern of Example 2.

In order to obtain a larger area of exposure, the beam from a He-Cd laser at 442 nm was reflected from a mirror located behind the plane of the target, through a 20× expansion lens and a 15 micrometer spatial filter located 18 cm in front of the plane of the target. The three-mirror array was 42 cm from the expansion lens and filter. Each mirror was 5 cm in diameter, arranged in a triangular array with the center of each mirror 10.2 cm from the other two mirrors. The light from the three-mirror array was reflected a distance of 54 cm to the target. The 15 by 30 cm target was mounted on a vacuum platen and comprised about a 10 micrometers thickness of Shipley photoresist AZ-1350J on 7 mil Mylar and exposure from 50 min for a 3-beam intensity of 47 mJ/cm$^2$. The photoresist was developed for 1 min. with Shipley developer AZ-351 diluted 3 to 1 with water. Silver was vacuum deposited on the relief image in an amount sufficient to make the surface of the relief image electrically conductive. Employing a nickel sulfamate-nickel chloride electroform solution, 10 mils of nickel was plated over the silver relief pattern. The nickel electroform, which now constituted a negative image of the relief pattern, was removed and employed to emboss a layer of 5 mil cellulose acetate butyrate on a polyester support wherein the cellulose acetate butyrate was softened by a mixture of 80 parts toluene, 20 parts acetone and 6 parts with FLUORAD FC-170-C a fluorinated alkyl polyoxyethylene ethanol sold by 3M Corp., St. Paul, Minn. The embossing was carried out by superimposing the nickel electroform over the cellulose acetate butyrate layer and passing the thus-formed sandwich through motor driven rubber rollers at 60 psi. FIG. 22 is a stereo pair of scanning electron micrographs at 10,000× magnification of the cellulose acetate butyrate replica of the original exposed and developed photoresist relief pattern.

EXAMPLE 3

Figure 23:
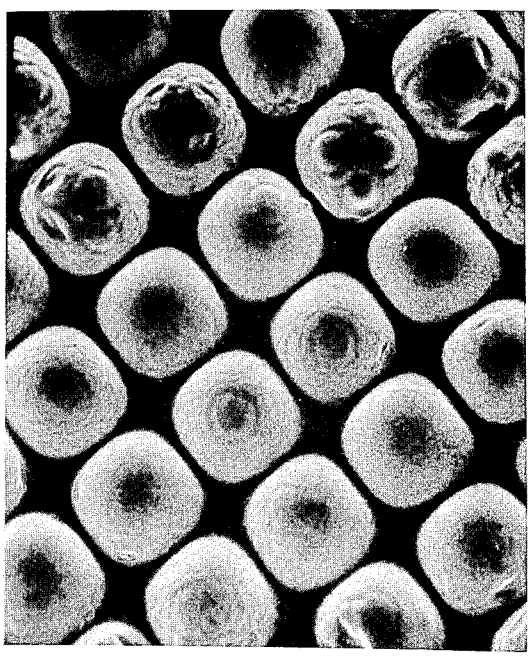
FIG. 23 is a scanning electron micrograph at 20,000× magnification of the relief pattern produced in Example 3.

A square array of substantially square deep holes was prepared employing the laser and target arrangement and procedure described in Example 1 except that a four-mirror array was employed with the mirrors arranged in a square configuration with 10 cm center-to-center spacing. The spatial filter employed a 20× lens, 15 micron pinhole and was located 111 cm from the mirror array. The mirror array was located 184 cm from the target. The target was the same as that used in Example 1. The total intensity of the exposure for the four beams was 187 mJ/cm$^2$. Development was carried out for 3 min in Shipley Developer AZ-1350J diluted 2 to 1 with water. FIG. 23 is a 2,000× magnification scanning electron micrograph of the photoresist after development.

EXAMPLE 4

Employing the exposure configuration set forth in FIG. 13, an array of hexagonal depressions was formed utilizing the division of amplitude procedure. The beam from a He-Cd laser 30 at 442 nm impinged on a variable beam splitter 36 which directed ⅓ of the beam to a first and second mirror 35 and 35a and then to a third mirror 37 from which the beam was directed to one of three sets of 10× expansion lens 38 and 15 micrometer spatial filter located 115 cm from the target. The distance from the variable beam splitter 36 to mirror 35 was 18 cm; from mirror 35 to mirror 35a was 27 cm; from mirror 35a to mirror 37 was 28 cm and from mirror 37 to spatial filter 38 was 66 cm.

Figure 24B:
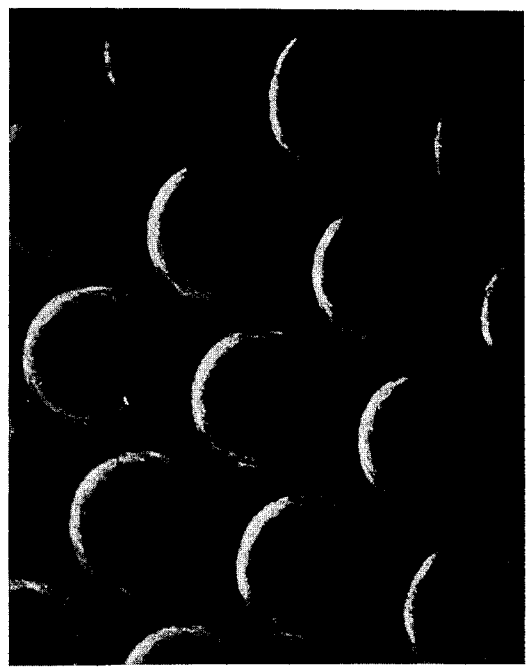
FIGS. 24A to E are scanning electron micrographs of two magnifications showing a series of relief patterns with a range of exposures as produced in Example 4.
Figure 24A:
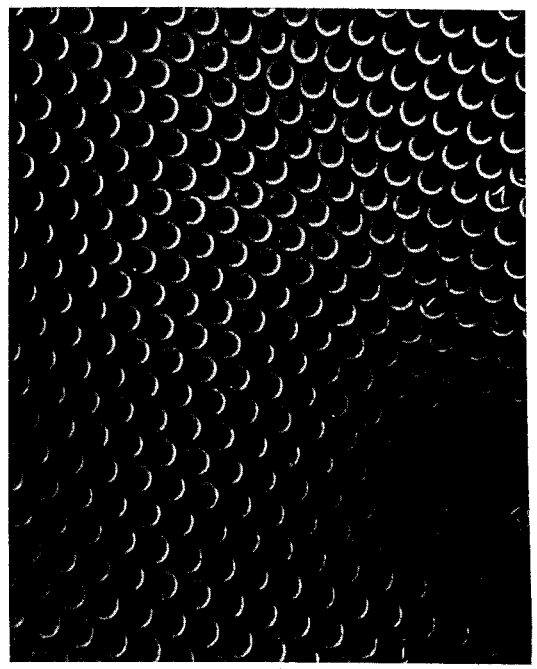
Figure 24D:
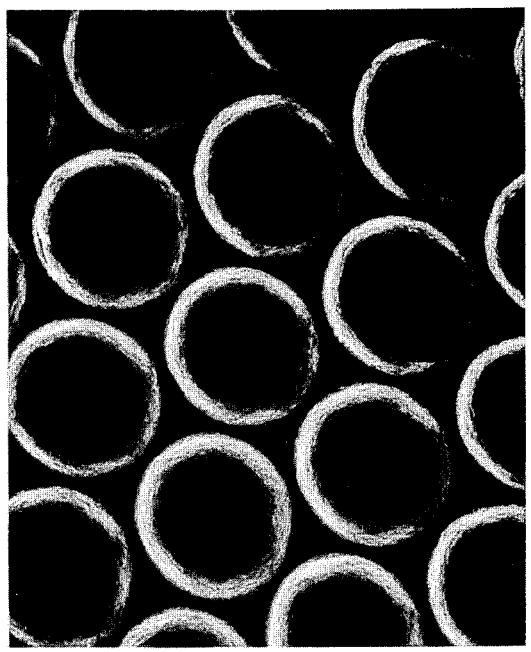
Figure 24C:
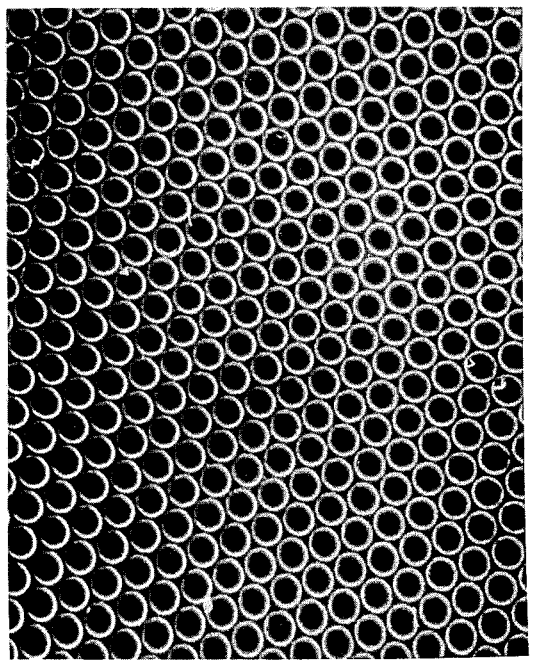
Figure 24F:
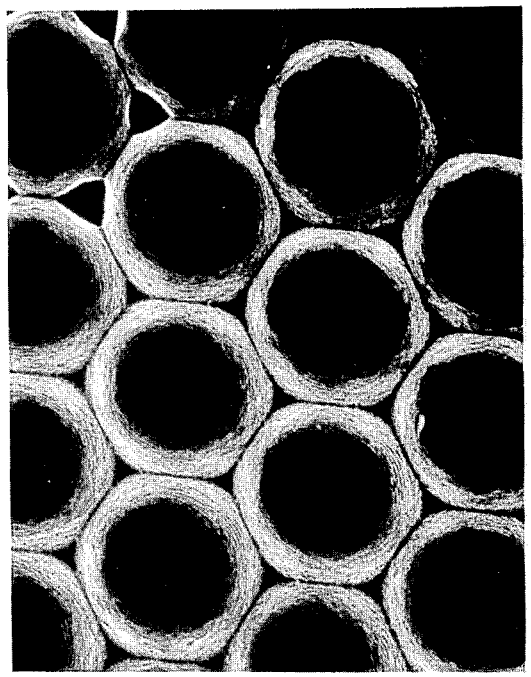
Figure 24E:
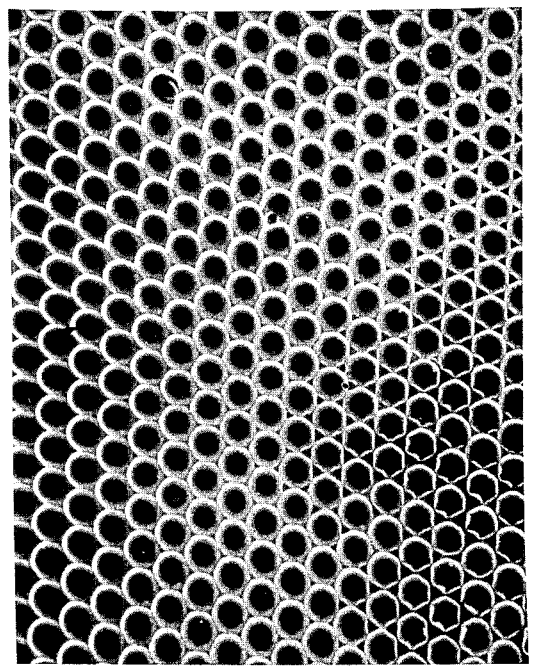

The remaining ⅔ of the beam which passed through the ⅓ beam splitter 36 impinged on mirror 36a located 7 cm from beam splitter 36 and thence to mirror 36b and beam splitter 31. The distance between mirrors 36a and 36b was 44 cm and from 36b to beam splitter 31 was 44 cm. One half of the beam was reflected to a mirror 32 15 cm from the beam splitter 31 which in turn reflected the beam 31 cm to the second set of said expansion lens and spatial filter 34. The remaining beam from 50-50 beam splitter 31 was reflected from mirror 40 13 cm from the beam splitter 31 31 cm to the third set of expansion lens and spatial filter 42. Sets of parallel glass plates 41 and 33 are employed as phase shifters to electronically stabilize the beams. The target 45 was about a 10 micrometer coating of Shipley photoresist AZ-1350J on 7 mil Mylar held in place by a vacuum platen. A range of exposures was employed; i.e. 21 mJ/cm$^2$; 31 mJ/cm$^2$ and 42 mJ/cm$^2$. Development was carried out for 3 min with Shipley Developer AZ-351 diluted 4 to 1 with water. FIGS. 24A to 24F are top view scanning electron micrographs of the developed photoresists. FIGS. 24A and 24B are electron micrographs at 2,000× and 10,000× magnification, respectively, of the underetched relief pattern wherein the total exposure intensity was 21 mJ/cm$^2$. FIGS. 24C and 24D are electron micrographs at 2,000× and 10,000× magnification, respectively, of the relief pattern wherein the total exposure intensity was 31 mJ/cm$^2$. FIGS. 24E and 24F are electron micrographs at 2,000× and 10,000× magnification, respectively of the relief pattern where the total intensity exposure was 42 mJ/cm$^2$. It will be noted that with the underetched array (FIGS. 24A and 24B) there are flat areas between holes with no saddle points, while with the overetched array (FIGS. 24E and 24F), there are no flat areas but small saddle points between the zero exposure points. Thus, when underetched, the array appears as circular holes. It is still a close packed hexagonal array.

What is claimed is:

1. An apparatus for simultaneously exposing a photosensitive material to at least three coherent beams of exposing radiation which comprises
   a laser;
   means for dividing the wavefront of said beam emanating from said laser into equal parts; at least three mirrors reflecting said divided beams, the number of said mirrors corresponding to the number of parts of said beam, and wherein
   said mirrors are located symmetrically around an axis perpendicular to the plane of the surface of said photosensitive material.

2. The apparatus of claim 1 where each of said sources are substantially equidistant from said photosensitive material.

3. The apparatus of claim 1 wherein the intensity of each of said sources is substantially the same.

4. The apparatus of claim 1 which includes three coherent beams.

5. The apparatus of claim 1 which includes four coherent beams.

6. The apparatus of claim 1 wherein said photosensitive material is a positive photoresist.

7. The apparatus of claim 1 wherein said photosensitive material is a negative photoresist.

8. The apparatus of claim 1 wherein said photosensitive material is carried on a light transmitting base and said exposure is made through said base.

9. An apparatus for simultaneously exposing a photosensitive material to at least three coherent beams of exposing radiation which comprises
   a laser;
   means for dividing the amplitude of the beam emanating from said laser into at least three equal parts;
   separately expanding each of said divided beams by expansion lenses to impinge upon said photosensitive material; whereby said expansion lenses are arranged symmetrically around an axis perpendicular to the plane of the surface of said photosensitive material.

10. The apparatus of claim 9 where each of said sources are substantially equidistant from said photosensitive material.

11. The apparatus of claim 9 wherein the intensity of each of said sources is substantially the same.

12. The apparatus of claim 9 which includes three coherent beams.

13. The apparatus of claim 9 which includes four coherent beams.

14. The apparatus of claim 9 wherein said photosensitive material is a positive photoresist.

15. The apparatus of claim 9 wherein said photosensitive material is a negative photoresist.

16. The apparatus of claim 9 wherein said photosensitive material is carried on a light transmitting base and said exposure is made through said base.

* * * * *